(12) United States Patent
Touwslager

(10) Patent No.: US 7,695,875 B2
(45) Date of Patent: Apr. 13, 2010

(54) PHOTO-SENSITIVE COMPOSITION

(75) Inventor: Fredericus Johannes Touwslager, Eindhoven (NL)

(73) Assignee: Koninklijke Philips Electronics, Eindhoven (NL)

( * ) Notice: Subject to any disclaimer, the term of this patent is extended or adjusted under 35 U.S.C. 154(b) by 0 days.

(21) Appl. No.: 10/503,248

(22) PCT Filed: Feb. 5, 2003

(86) PCT No.: PCT/IB03/00400

§ 371 (c)(1),
(2), (4) Date: Aug. 2, 2004

(87) PCT Pub. No.: WO03/067333

PCT Pub. Date: Aug. 14, 2003

(65) Prior Publication Data

US 2005/0089791 A1      Apr. 28, 2005

(30) Foreign Application Priority Data

Feb. 5, 2002   (EP)   .................................. 02075473

(51) Int. Cl.
    *G03F 7/021*   (2006.01)
(52) U.S. Cl. .................. 430/18; 430/168; 430/175; 430/195; 430/320
(58) Field of Classification Search ................ 430/175, 430/195, 18, 320, 168; 252/500, 501.1
    See application file for complete search history.

(56) References Cited

U.S. PATENT DOCUMENTS

| 4,614,701 | A |   | 9/1986  | Mori et al. |
| 5,300,575 | A | * | 4/1994  | Jonas et al. .................. 525/186 |
| 5,347,144 | A |   | 9/1994  | Garnier et al. |
| 5,370,825 | A | * | 12/1994 | Angelopoulos et al. ..... 252/500 |
| 5,447,824 | A | * | 9/1995  | Mutsaers et al. ............ 430/315 |
| 5,725,978 | A | * | 3/1998  | Miyazawa .................... 430/25 |
| 5,948,596 | A | * | 9/1999  | Zhong et al. ............. 430/278.1 |
| 5,990,269 | A |   | 11/1999 | Neubecker et al. |
| 6,638,680 | B2 | * | 10/2003 | Lamotte et al. ............. 430/160 |
| 6,830,708 | B2 | * | 12/2004 | Angelopoulos et al. ..... 252/500 |
| 6,855,949 | B2 | * | 2/2005  | De Leeuw et al. ............ 257/40 |

FOREIGN PATENT DOCUMENTS

EP     1003179 A1    5/2000
EP     1079397 A1    2/2001
JP     09043836 A    2/1997
JP     2004504693 A  2/2004
WO     99/10939 A2   3/1999
WO     01/20691 A1   3/2001

OTHER PUBLICATIONS

A.R. Brown et al, "Field-effect transistors made from solution-processed organic semiconductors", Synthetic Metals 88, 1997, pp. 37-55.
Hayashi et al, "New Water-soluble Photoresists Utilizing Polymeric Azide Sensitizers", Electron Tube & devices Division and Central Research Lab, Hitachi Ltd, Tokyo, Japan, pp. 559-560.

* cited by examiner

Primary Examiner—John S Chu

(57) ABSTRACT

The invention pertains to a photo-sensitive composition which comprises a photochemical initiator, a polyacid or a salt thereof, and a poly(3,4-alkylenedioxythiophene) wherein the alkylene moiety is —(CH2)n-, n being an integer from 1 to 3, or 1,2-cyclo-hexylene, which may optionally be substituted, characterized in that the photochemical initiator is a water-soluble polymer comprising at least two azide or diazonium groups. Preferably, the water-soluble polymer is chemically stable at pH 6 or less, more preferably at pH 2 or less.

5 Claims, 2 Drawing Sheets

PHOTO-SENSITIVE COMPOSITION

Figure 1:
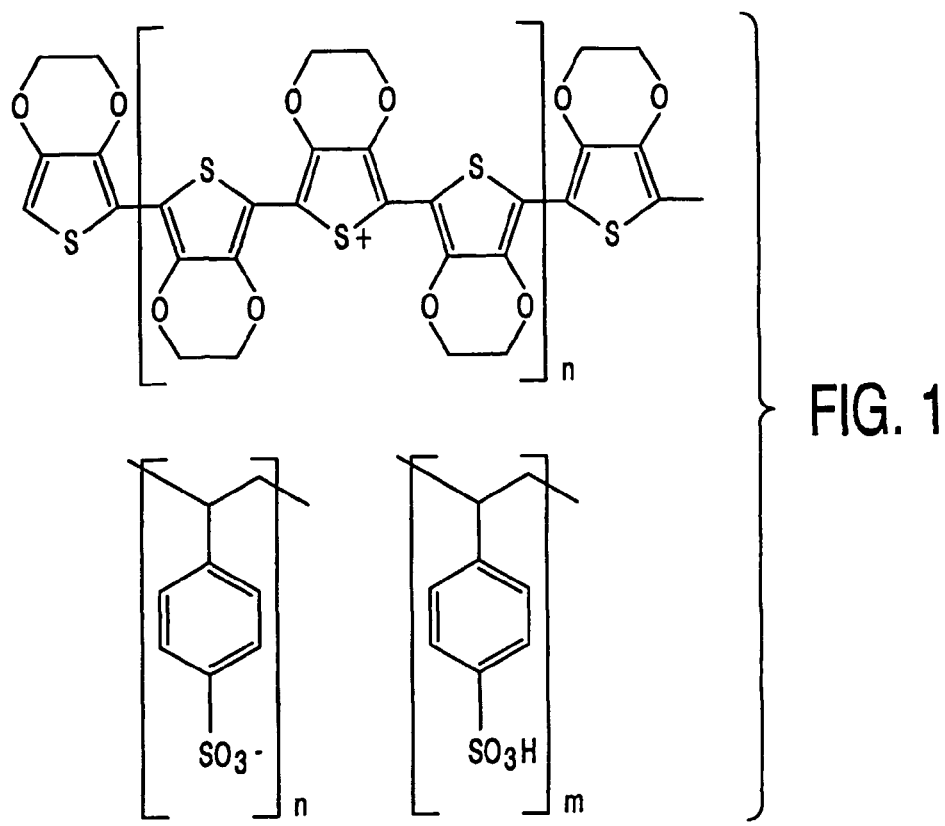

The invention pertains to a photo-sensitive composition comprising a photochemical initiator, a polyacid or a salt thereof, and an organic conductor a method for making the photo-sensitive composition, the use of the photochemical initiator for cross-linking the poly(3,4-alkylenedioxythiophene), and the use thereof for the manufacture of electrically conductive parts. Another aspect of the invention pertains to an electronic component or a poly-LED comprising the said photo-sensitive composition.

Photo-sensitive composition comprising a photochemical initiator, a polyacid or a salt thereof, and a poly(3,4-alkylenedioxythiophene) are known as organic conductor from WO 01/20691. In this patent application an electronic component is disclosed wherein the relief structure contains a polyacid salt of a poly-3,4-alkylenedioxythiophene, in which the alkylene group is chosen from the group consisting of a methylene, a 1,2-ethylene, a 1,3-propylene, and a 1,2 cyclohexene group, which groups are optionally provided with one or more substituents, and wherein the relief structure comprises at least one electrode.

The stable conductivity of the component is achieved through the choice of a specific electrically conductive salt of a specific group of poly(3,4-substituted thiophenes), which group of polythiophenes is also called PEDOTs. The PEDOTs have a relatively high conductivity and conductivities higher than 100 S/cm have been disclosed, which is attributed to the oxygen substitutions at the 3,4-positions of the alkylene moiety of the poly(3,4-alkylenedioxythiophene).

The photochemical initiator that was used is the bisazide 4,4'-diazidodibenzalacetone-2,2'-disulfonic acid disodium salt. This compound initiates the crosslinking upon irradiation at a wavelength of 360-370 nm. This is advantageous, as such a wavelength is provided by a mercury lamp. Further, with initiators initiating the cross-linking upon irradiation at a shorter wavelength, such as less than 300 nm, the irradiation will probably influence the conductivity of the PEDOTs. With initiators initiating the cross-linking upon irradiation at a larger wavelength, such as more than 400 nm, the initiator initiates due to normal light and the process should be executed in a dark room. Other lowmolecular initiators, such as perchlorate, chromate and iron (III) tris(toluenesulfonate) were also disclosed and were assumed to be brought into an excited state by irradiation, after which they act as strong oxidizers towards the conjugated chain of poly-3,4-ethylenedioxythiophenes in the radiation-sensitive layer and demolish the conjugation. A specific example is disodium chromate. By heating to 150° C. after irradiation of the chromate-doped layer of a poly (styrene sulfonic acid) salt of PEDOT, the electrically conductive PEDOT can be made insoluble in water. The irradiated parts can be subsequently dissolved in water or some other polar solvent such as an alcohol, so as to form the relief structure. The removal of the areas during the developing step can be enhanced in a spray process.

These initiators, however, suffer from side reactions with oxygen and/or with the present acid, and sometimes are not sufficiently stable under the acid conditions of the polythiophene-polystyrene sulfonic acid mixture. A solution could be to increase the pH of the mixture, but such increase, for instance by the addition of a base, results in a decrease of the conductivity of the resulting conductive parts. It was also found that high concentrations of initiator, and high doses were necessary to obtain acceptable conductive layers. It was further found that the choice of the substrate was limited with this type of initiators, for instance glass substrates could then not be used.

It is therefore an object of the invention to find photochemical initiators that do not suffer from the above disadvantages, are stable under acidic conditions and show increased conductivity. Further advantages such as improved relief structures with steeper walls and flatter upper-sides, lower concentrations of the initiator in the photo-sensitive compositions, lower doses, better substrate compatibility, and intrinsic insensibility for oxygen become clear from the description and examples.

It was now found that of a new class of photoinitiators is very stable at lower pH, leading to highly conductive layers when applied in said photo-sensitive compositions, satisfy to the above-mentioned advantages and furthermore retain all advantages of the prior art initiators. The invention therefore pertains to a photo-sensitive composition which comprises a photochemical initiator, a polyacid or a salt thereof, and an organic conductor characterized in that the photochemical initiator is a water-soluble polymer comprising at least two azide or diazonium groups. The photo-sensitive composition is preferably chemically stable at pH 6 or less, more preferably at pH 2 or less.

The water-soluble polymer comprising at least two azide or diazonium groups can be a homo- or co-polymer. Suitable polymers comprise a repeating unit having the formula —[R(X—$R_1$)—], wherein X is an aromatic group-containing moiety, $R_1$ is an azide- or diazonium group attached to the aromatic group of moiety X, and R is a substituted or unsubstituted C1-C6 alkylene group, and with preference $R_1$ is the diazonium group $N_{2+}A_-$, in which $A_-$ is an inorganic or organic anion and X is —CONH—$C_6H_4$—. The (in)organic anion can be any suitable anion such as halide among which chloride, hydrogen sulfate, tetrafluoro borate, hydrogen phosphate, thiocyanate, hexafluorophosphate, dodecylsulfate, and the like. When the alkylene group is substituted, the substituent may be phenyl, halogen, hydroxy, and the like.

The aromatic group is preferably a phenyl group. The hydroxy group may be etherified, esterified or, two hydroxy substituents may be ketalized to form a cyclic structure. Such hydroxy group is suitable to use as anchor point for attaching moiety X, for instance through an ether or ester linkage, or through a ketal group when two hydroxy groups are present in the repeating unit. Moiety X serves as a spacer between the backbone of the repeating unit and the phenyl group to which the azide or diazonium group is attached. The precise chemical structure of this spacer is not important and is usually determined by the simplicity of the chemical synthesis and the availability thereof. Esters and ketals are less preferred because they may hydrolyze in strong acidic media, like the PEDOT/PSS latex.

The photo-sensitive compositions of the invention comprise polyacids, which are less vulnerable to attack by contaminating alkaline molecules than other organic and inorganic acids. Polyacids have a polymeric structure that appears to hamper diffusion of both the contaminating alkaline molecules and the polyacids themselves. To benefit from the advantages of WO 01/20691 it is preferred to use a component of the kind described therein, which has a stable conductivity.

Examples of polyacids include poly(styrene sulfonic acid), polyacrylic acid, polymethacrylic acid, poly(vinyl sulfonic acid), poly(vinyl sulfuric acid), poly(vinyl boric acid), poly (styrene boric acid), poly(vinyl phosphoric acid), poly(styrene phosphoric acid), poly(C1-C12 alkyl sulfonic acid substituted ethylenedioxythiophene), poly(C1-C12 alkoxy sulfonic acid substituted ethylenedioxythiophene). The polyacid can further be a copolymer of a conductive polymer and a polyacid, wherein the chain comprises blocks of conductive units, for example of a PEDOT, and blocks of acid units.

Examples of substitutions optionally present at the alkylene groups are C1-C12 alkyl groups, C1-C12 alkoxy groups, phenyl groups, acid groups, such as sulfonic acid, carboxylic acid, boric acid and sulfuric acid, acid substituted C1-C12 alkyl-and C1-C12 alkoxy groups. The substitutions can be used for several objects, such as to influence the solubility of the organic conductor in different solvents, and to provide a structure giving a higher order in the relief structure.

Examples of organic conductors include the PEDOTs i.e. poly(3,4-alkylenedioxythiophene) wherein the alkylene moiety is —$(CH_2)_n$—, n being an integer from 1 to 3, or 1,2-cyclohexylene, which may optionally be substituted, polyaniline, polypyrrole, polyactylene, among others, that may be substituted with alkylgroups, alkoxygroups, and the like, the substituents having a chain length of 1-12 carbon atoms for instance. Also ring shaped, aralkyl and alkaryl substituents can be present. It is preferred to use the PEDOTs. The polyacid PEDOT salt has a very high stability against bases. This is advantageous from the perspective of the manufacture or electronic components, such as integrated circuits, as organic insulators have often a basic character, or are applied with a basic solvents. It is remarkable of this manner structuring the organic conductor, that it is broadly applicable. Diazonium compounds are known to have rather limited solybility in the presence of organic sulphates. After filtering the composition, the concentration of diazonium compounds is about 0.005% by weight (in the examples). Apparently and surprisingly, this is sufficient to provide the relief structure. More important, it turns out to work for organic conductors as different as polyaniline and PEDOT.

The structure comprising a polyacid PEDOT salt may comprise interconnects and resistors in addition to one or more electrodes. The electrodes may, for example, be part of a diode, a light-emitting diode, a bipolar transistor or a field-effect transistor. A clear advantage of a component with an electrically conductive relief structure comprising a polyacid salt of a PEDOT is the excellent stability of the relief structure and of the material when the structure is brought in contact with, for example, organic and aqueous solvents, polymeric melts, or deposited vapors. Relief structures containing a PEDOT salt are less vulnerable to dissolution and to deterioration of their conductivity in alkaline solutions.

A layer on a substrate surface, which comprises a pattern of an electrically conductive PEDOT is known from U.S. Pat. No. 5,447,824. This layer comprises conductive areas and less conductive areas. However, leakage currents taking place through the less conductive areas hamper the use of the conductive areas as electrodes.

The component with an electrically conductive relief structure of a salt of a PEDOT may be realized by, for example, printing techniques such as microcontact printing, inkjet printing, and silkscreen printing. Lithographic techniques may alternatively be used, especially for the manufacture of tracks with relatively small track widths and relatively small distances between tracks.

In an embodiment of the component of the invention, the optionally present substitution contains a sulfonic acid. The acid can also be present as its acid anion. The extent to which the acid is present as its acid anion, presumably depends on the acidity of the solution, from which the relief structure is formed. The advantage of such a substitution is that the PEDOT itself is water-soluble before cross-linking. In effect, the substitution gives the PEDOT an acidic character, such that the PEDOT is to be considered as a polyacid itself.

Clearly, an additional polyacid is not absolutely needed in this embodiment. An additional advantage is the increase of the amount of PEDOT per cubic centimeter that is present in the relief structure of the component of the invention, which results in a better conductivity. In a further embodiment of the component of the invention, the relief structure comprises neighboring tracks, which lie at a distance of less than 10 μm from one another.

Such relief structures are suitable for use in integrated circuits. In this application neighboring tracks are used as parts of the source and the drain electrode of a MOS-type field-effect transistor. The distance between neighboring tracks will be filled with semiconductor material and will function as a channel. Hence, the distance between neighboring tracks is equal to the channel length cL. This has at least two important implications. First, the switching speed of the transistor is dependent on the channel length. According to the theory of field-effect transistors, this dependence is quadratic. With a channel length of less than 10 μm, it is possible to obtain bit rates of 1 kbit per second. An integrated circuit with such a bit rate is suited for use in data storage and transponders. Besides, as is known from Brown et al., Synthetic Metals 88 (1997), 37-55, a small channel length also leads to a high on-off ratio in the transistor, which is a measure for the quality of the transistor. Secondly, in order to have an integrated circuit, there is not only the need of a small channel length, but also the need for 'gain.' The term 'gain' means that the output signal of a transistor or sets of coupled transistors such as NAND-, NOR-, AND-, OR-building blocks, has a voltage, which is as least as high as the voltage of the input signal. It was found that with channel lengths of less than 10 μm the gain is larger than 1.

In addition hereto, the conductive relief structures can be used in displays, particularly for flexible or even rollable displays. The relief structures are herein used as electrodes of the pixel transistors and further as datalines. The conductivity of the relief structure is sufficient for this use, even without strengthening the layer with metal. In connection herewith, it is particularly advantageous to use electrophoretic materials as the electro-optical layer in the display.

In a preferred embodiment of the component of the invention, the neighboring tracks are able to function as a pair of a source and a drain electrode. At least one of the tracks is furcate, having more than one prong, while the electrodes are interdigitated. These electrodes are positioned so as to enlarge the area of mutual exposure. This embodiment enlarges the source-drain current at a chosen drain voltage, and thereby the on/off ratio.

In another embodiment of the electronic component of the invention, the component comprises a second relief structure of an electrically conductive material, separated from said first relief structure at least by an insulating layer. The second relief structure prevents leakage currents between tracks in use as interconnects and between tracks in use as electrodes in different transistors, diodes, and capacitors.

In a preferred embodiment, the second relief structure also comprises a salt of a PEDOT.

In a further embodiment, the component of the invention comprises a field effect transistor. Such a transistor contains a source and a drain electrode, which are interconnected through a channel comprising a semiconducting material. It further comprises a gate electrode, which is separated from the source and the drain electrode by at least an insulating layer. In this embodiment one, relief structure of the component contains the source and the drain electrode. Preferably, these electrodes interdigitate in order to enlarge 30 the channel width. Another relief structure contains the gate electrode. At least one of said relief structures is the relief structure comprising a salt of a PEDOT. The other, second electrically conductive relief structure comprises a salt of a PEDOT, a polyaniline, silicon, or a metal such as gold. As is known in the art of transistor manufacture, different designs are possible, such as a 'top-gate' design and a 'bottom-gate' design.

In another embodiment of the component of the invention, the salt of the PEDOT is a polyacid salt. Poly(styrene sulfonic acid) is a preferred polyacid.

In a further embodiment, not only the first relief structure, but the complete component substantially consists of polymeric material. Such "all-polymeric" device has favorable properties, such as a high mechanical flexibility and a low weight. Besides, the component is cheap, and hazardous substances may easily be avoided during its manufacture.

Organic materials for the semiconductor layer are known from WO 99/10939. Examples include polypyrroles, polyphenylenes, polythiophenes, polyphenylene-vinylenes, polythienylene-vinylenes, poly(di)acetylenes, polyfuranes, polyfuranylenevinylenes, polyanilines. Alternatively, substituted derivatives of these polymers are applied.

Examples of substituents are alkyl and alkoxy groups and ring-shaped groups, such as alkylenedioxy groups. By preference, the substituent groups have a carbon chain of 1 to carbon atoms. As is known to those skilled in the art, such materials may be rendered semiconducting by doping with, for example, an oxidizing agent, a reducing agent, and/or an acid. A preferred choice of an organic material is polythienylene-vinylene. Oligomers such as pentacene may also be used as organic semiconductor material.

Organic materials for the insulating layer are known from U.S. Pat. No. 5,347,144. Examples include polyvinyl phenol, polyvinyl alcohol and cyanoethyl pullane. Preferably, an insulating material with a dielectric constant of at least six is used, such as polyvinyl phenol, which can be rendered insoluble by cross-linking with a cross-linking agent such as hexamethoxymethylene melamine and heating.

Substrate materials are, for example, polymers such as polystyrene, polyimide, polyamide, and polyester, or glass, ceramics, or silica.

The object relating to the method is achieved in that the method of manufacturing a relief structure on a substrate comprises the steps of forming a radiationsensitive composition which comprises the photochemical initiator of this invention, a salt of an anion of a polyacid, and a poly-3,4-alkylenedioxythiophene, in which the alkylene group is chosen from the group consisting of an methylene group, a 1,2-ethylene group, a 1,3 propylene group, and a 1,2-cyclohexylene group, which groups are optionally substituted;

providing said radiation-sensitive composition onto the substrate so as to form a layer;

irradiating said layer in accordance with a desired pattern, thereby obtaining irradiated areas and non-irradiated areas; and developing said layer so as to form the electrically conductive relief structure in the desired pattern.

The object relating to the method contains three elements: the manufacture of tracks with stable conductivity, the manufacture of components with narrow tracks, and lowcost manufacture. The stable conductivity is realized in that the composition used in the method according to the invention comprises a salt of a PEDOT. Such a composition is commercially available, but it was not known that this composition could be applied in the manufacture of electrically conductive relief structures. U.S. Pat. No. 5,300,575 teaches the use of this composition to provide an anti-static layer only.

The narrow tracks can be obtained by the use of a salt of a PEDOT containing a polyacid anion as a counter-ion, hereinafter also referred to as a polyacid salt. This polyacid salt substantially enhances the processability of the PEDOT. As a polyacid is soluble in polar solvents such as water, the polyacid salt of the PEDOT is also more or less soluble in water or at least miscible with water. Through UV-irradiation of a layer of a polyacid salt of PEDOT in a desired pattern and subsequently re-dissolving the salt, relief structures with track widths and channel lengths of 10 µm can be obtained. In the art of plastic electronics, such tracks may be called narrow.

The low-cost manufacture is realized in that it is not necessary to use resist layers, and in that water can be used as a solvent. The layer is preferably washed with water in the developing step.

In the method of the invention, the radiation-sensitive layer can be applied onto a substrate by spin-coating, web-coating, or electrical deposition of a solution or dispersion and a subsequent removal of the solvent or dispersion agent. The irradiation used may be UV-irradiation with a photomask, or laser light, electron, X-ray, or ion-beams. Irradiation influences the initiator present.

The initiators of the invention are assumed to initiate cross-linking betweenpolymeric molecules in the radiation sensitive layers. In the initiating process, the initiator molecules do react away. With such initiators, the non-irradiated areas are not cross-linked and will be washed away. It is therefore another object of the invention to use the photochemical initiator for cross-linking a poly(3,4-alkylenedioxythiophene) wherein the alkylene moiety is —$(CH_2)_n$—, n being an integer from 1 to 3, or 1,2-cyclohexylene, which may optionally be substituted, characterized in that the photochemical initiator is a water-soluble polymer comprising at least two azide or diazonium groups, for instance for the manufacture of electrically conductive parts in plastic conductors for electronic components and in polymeric light emitting diodes (poly-LED's).

In another object of the invention there is provided in an electronic component or a poly-LED comprising an electrically conductive relief structure 3 comprising at least one electrode on a surface of an electrically insulating substrate 2, characterized in that the electrically conductive relief structure 3 is obtainable by the cross-linking reaction of a poly(3,4-alkylenedioxythiophene) wherein the alkylene moiety is —$(CH_2)_n$—, n being an integer from 1 to 3, or 1,2-cyclohexylene, which may optionally be substituted, in the presence of a photochemical initiator, which is a water-soluble polymer comprising at least two azide or diazonium groups.

In a preferred embodiment of the method of the invention, the composition comprising the polyacid salt of the PEDOT is filtrated before application on the substrate. Preferably, a filter having pores with a diameter of 5 µm or less is used in the filtration. The filtration prevents the eventual presence of particles larger than the widths of the tracks formed.

In a further embodiment of the method of the invention, the electrical conductivity of the relief structure is enhanced by an additional step performed after washing, in which step the relief structure is doped with an organic compound containing a first functional group selected from dihydroxy, polyhydroxy, carboxyl, lactam and amide, sulfon, sulfoxy, phosphate, and urea. The enhancement of the electrical conductivity is unexpectedly large, while the relief structure is not damaged or demolished. The inventors tentatively presume, without being bound by it, that the doping with said organic compound provides a change in the microstructure of at least part of the relief structure. Besides, the inventors have the impression that the doping after washing is very efficient: first, the solvent of the composition comprising a PEDOT salt has been removed at least for a major part at that moment. Molecules of the added organic compounds will interact with the polymeric molecules mainly. Secondly, the surface area of the relief structure is larger than the surface area of the layer. The distribution of the organic compound may be assumed to be reasonably good.

Suitable organic compounds containing dihydroxy or polyhydroxy, and/or carboxyl groups or amide groups are disclosed in WO 01/20691 and include sugar, sugar derivatives, and sugar alcohols, such as sucrose, glucose, fructose, lactose, sorbitol, mannitol and lactitol; alcohols such as ethylene glycol, glycerol, di-or triethylene glycol; carboxylic acids, such as furancarboxylic acid. Particularly preferred organic compounds are sorbitol and diethyleneglycol.

The following non-limiting examples illustrate the invention.

Procedure Used to Make Single Transistors and Logic

EMBODIMENT 1

The structural formula of the poly(styrene sulfonic acid) salt of poly-3,4-ethylenedioxythiophene is shown in FIG. 1. A composition of this salt in water is commercially available from Bayer. The concentration of PEDOT in this composition is 0.5% by weight and that of poly(styrene sulfonic acid) is 0.8% by weight. To the composition, apparently a colloidal solution, about 0.2% by weight of the diazonium resin SCL 22S (the condensation product of 4-diazo-diphenylamine bisulfate and formaldehyde; Secant Chemicals Inc. MA USA) was added. After filtration through a 5 µm filter, the composition was spin coated onto an insulating and planarized substrate. The layer obtained was dried at 60° C. for 3 minutes. The dried layer was exposed through a mask to patterned radiation with UV light ($\lambda$=365 nm) by means of an Hg lamp. The layer was developed in a spray developer with water. In this developing step, the non-irradiated areas of the layer were removed. After drying at 200° C., the average layer thickness of the remaining areas was 80 nm. These areas had an electric conductivity of 1 S/cm. Each continuous undissolved area functions as a track. Track widths of 1, 3, 5, 8, 10 and 20 µm and distances between tracks of 1, 3, 5, 8, 10 and 20 µm were obtained in various experiments.

EMBODIMENT 2

The same procedure for obtaining relief structures was followed as in Embodiment 1. However, after the washing and drying at room temperature, in which the relief structure comprising PEDOT was obtained on the substrate, a solution of sorbitol (about 4-6% by weight) was spin-coated onto the relief structure. The resulting structure was heated to 200° C. The remaining areas had a conductivity of 170 S/cm. Each continuous undissolved area functions as a track.

EMBODIMENT 3

A solution of polyaniline and poly (styrene sulphonic acid) in a concentration of 4.0 weight % is commercially available from Covion as PAT010. To this solution was added about 0.4% by weight of the above mentioned diazonium resin SCL 225. After filtration through 1 µm filter, the composition was spincoated on an insulating and planarized substrate. The layer was dried at 60° C. during 3-5 minutes. It was exposed through a mask to patterned radiation with UV light ($\lambda$=365 nm, intensity=10 W/cm$^2$) during 20 seconds. The layer was developed in a spray developer with water. Track widths in the micrometer range from 1-50 µm were obtained. The conductivity was in the order of 10 S/cm. This conductivity can be improved however through a suitable choice of the polyaniline from those commercially available.

EMBODIMENT 4

Figure 2:
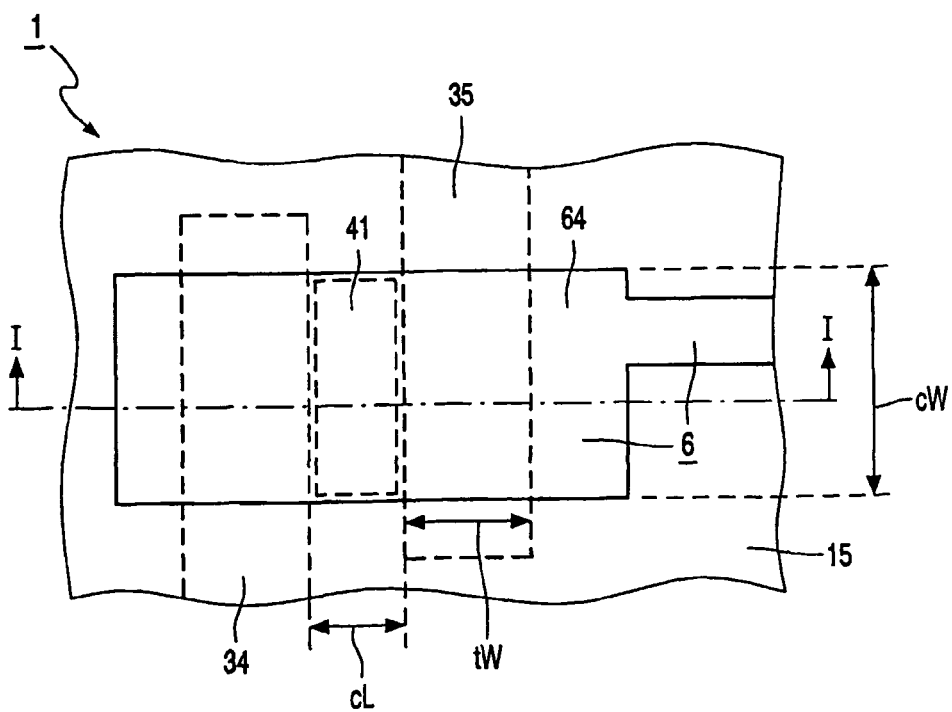
Figure 3:
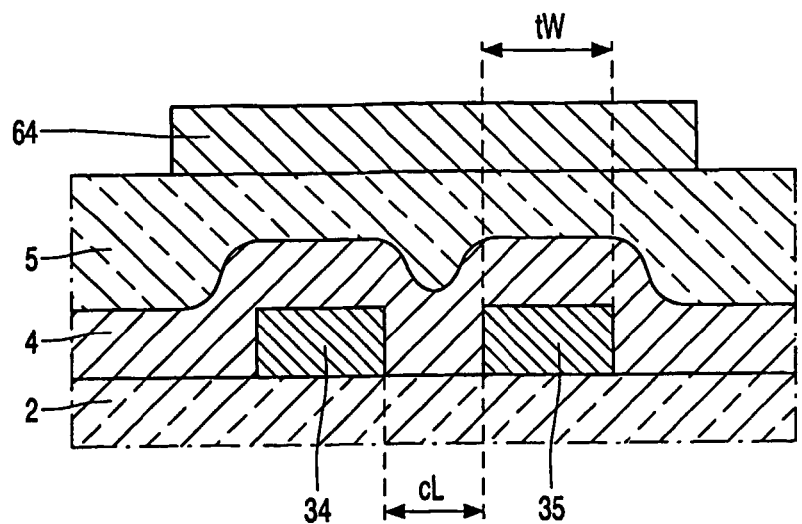

FIG. 2 diagrammatically shows a plan view of a field-effect transistor 1, comprising conductive relief structures of the component according to the invention. FIG. 3 diagrammatically shows the field-effect transistor 1 in a cross-sectional view (not true to scale) taken on the line I-I of FIG. 2. The field-effect transistor 1 comprises an electrically insulating substrate 2 of polyimide covered with a planarized layer of polyvinylphenol crosslinked with hexamethoxymethyl melamine, on which is provided a first electrically conductive structure comprising poly(3,4-ethylenedioxythiophene), poly(styrene sulfonic acid) and sorbitol. The relief structure comprises a source electrode 34 and a drain electrode 35 with a track width tW of 5 µm. On the first relief structure a semiconductor layer 4 comprising poly(thienylene-vinylene) is provided, which layer 4 comprises a channel 41 (not indicated in FIG. 3; shown in FIG. 2) with a channel length cL of 15 µm and a channel width cW of 50 µm. Covering the layer 4 and thus the channel 41 is an electrically insulating layer 5 comprising the commercially available HPR504, which is deposited as a solution in ethyl lactate. It electrically insulates the gate electrode 64 from the channel 41, said gate electrode 64 being accommodated in the second electrically conductive relief structure comprising PEDOT. The transistor is of the "top gate" type. The transistor may be protected against moisture and the like by a protective layer, for instance a polycarbonate or polyacrylate layer and the like, overlaying the second electrically conductive relief structure and covering the total transistor.

EMBODIMENT 5

Figure 4:
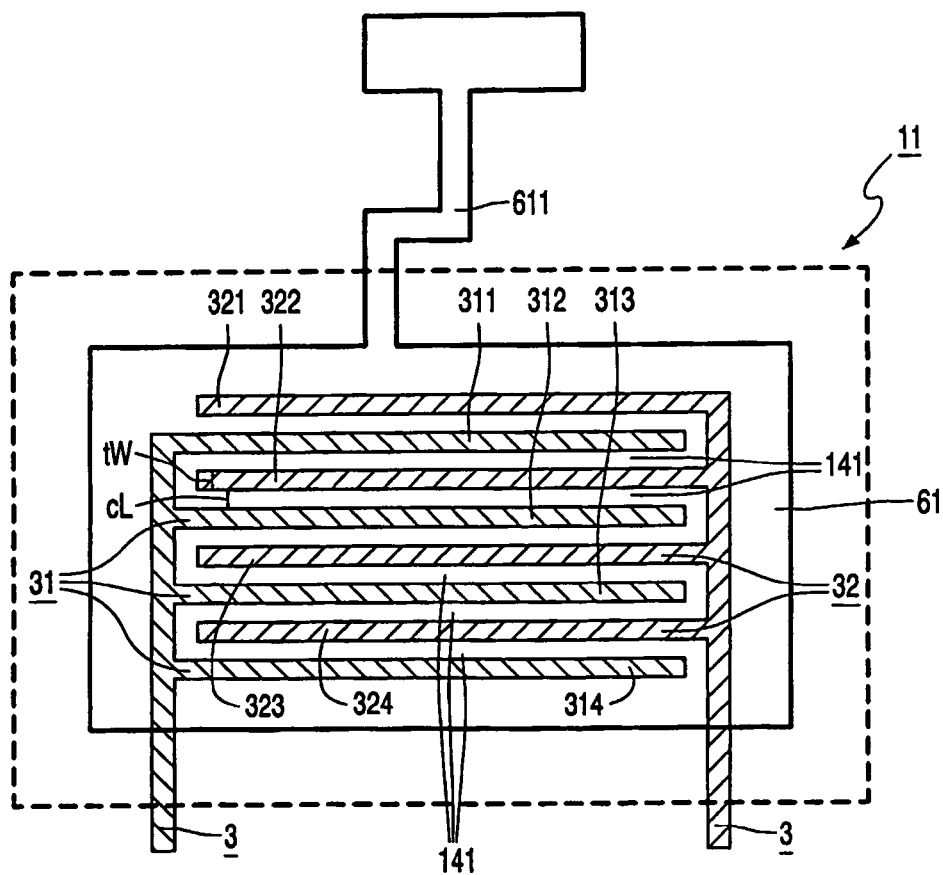

FIG. 4 diagrammatically shows a plan view of a field-effect transistor 11, which comprises a first relief structure 3 comprising poly(3,4-ethylenedioxythiophene), poly(styrene sulfonic acid) and sorbitol and accommodating an interdigitated pair of source electrode 31 and a drain electrode 32. The substrate, the insulating layer and the semiconductor are omitted from the drawing for reasons of clarity. The source electrode 31 is fork-shaped and comprises parallel tracks 311, 312, 313, and 314. The drain electrode is fork-shaped and comprises tracks 321, 322, 323, and 324. In this example, each of the electrodes 31, 32 comprises four tracks with a track width tW of 2 µm; however, this is neither necessary nor meant to be limiting. The source 31 and drain electrode 32 are separated by a channel 141 with a channel length cL of 5 µm. The transistor 11 further comprises a second relief structure comprising poly(3,4-ethylenedioxythiophene), poly(styrene sulfonic acid) and sorbitol and accommodating electrical conductors 611 and a gate electrode 61. The transistor is of a "bottom gate" type. In this type of transistors the second relief structures lies on the substrate, on which the dielectric layer, the first relief structure, and the semiconductor layer comprising pentacene are arranged in that order.

With these procedures the following devices were made:
Vertical interconnects with a contact resistance of 3.5 k.,
Transistors with a channel length down to 1 µm, having off-currents of 10 pA and on-currents of 1 µA and having a mobility up to $10_{-2}$ cm$_2$/V.s, Invertors with a gain >1 (important for ring oscillators),
Ring oscillators based on: 7 stage invertor with a frequency up to 1.3 kHz at 25V
 7 stage 2 input NAND invertor with a frequency up to 400 Hz at 15V 10

Examples of some water-soluble polymeric compounds containing either diazonium or azide groups are:

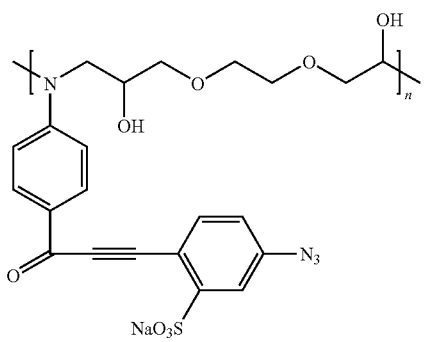

1)
A product of Toyo Gosei Kogyo (Japan) TGK-AS-98
2)

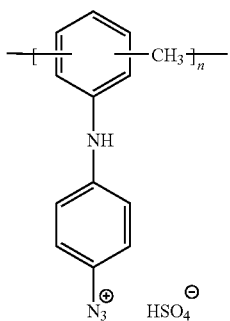

Diazo resins as disclosed in M. P.Schmidt and R.Zahn, German Patent 596731 (1934)
3)

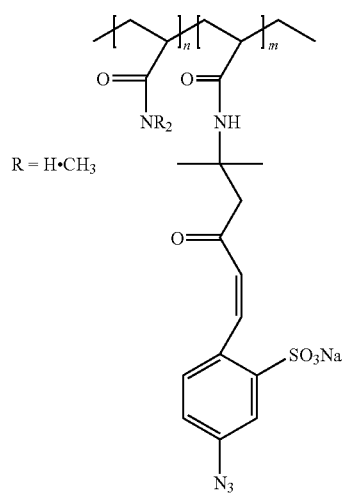

Polyacrylamides functionalized with an azide or diazonium containing group, e.g. U.S. Pat. Nos. 5,990,269 and 5,725,978.
4)

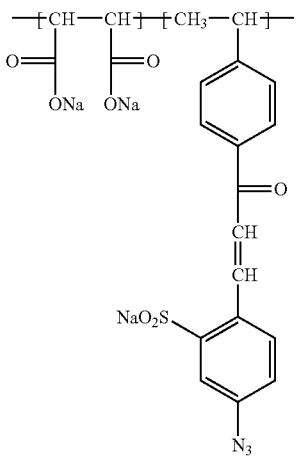

Poly(styrene-maleic anhydride) copolymers functionalized with an azide. Hayashi et.al. Polymeric Materials Science and Engineering (1995), Vol. 73, pp559-560.

The invention claimed is:

1. A method for making a photo-sensitive composition which is stable at a pH of 2 or less, the method comprises mixing together a photochemical initiator, a polyacid or a salt thereof, and an organic conductor, wherein the photochemical initiator is a water-soluble polymer comprising at least two azide or diazonium groups, and wherein the organic conductor is a poly(3,4-alkylenedioxythiophene) wherein the alkylene moiety is 1,2-cyclohexylene.

2. The method for making the photo-sensitive composition of claim 1 wherein the photochemical initiator is a water-soluble polymer comprising at least two azide or diazonium groups and a repeating unit having the formula —[R(X—R1)—], wherein X is an aromatic group-containing moiety, R1 is an azide or diazonium group attached to the aromatic group of moiety X, and R is a substituted or unsubstituted C1-C6 alkylene group.

3. The method for making the photo-sensitive composition of claim 2, wherein R1 is the diazonium group —N2+A-, in which A- is an inorganic or organic anion and X is —CONH—C6H4.

4. The method for making the photo-sensitive composition of claim 1, for the manufacture of electrically conductive parts in plastic conductors for electronic components and in polymeric light emitting diodes (poly-LED's).

5. An electronic component comprising an electrically conductive relief structure comprising at least one electrode on a surface of an electrically insulating substrate wherein the electrically conductive relief structure is obtained by the cross-linking reaction of an organic conductor in the presence of a photochemical initiator to form a photosensitive composition which is stable at a pH of 2 or less, wherein the organic conductor is a poly(3,4-alkylenedioxythiophene) wherein the alkylene moiety is 1,2-cyclohexylene and wherein the photochemical initiator is a water soluble polymer comprising at least two azide or diazonium group.

* * * * *